(12) United States Patent
Lai et al.

(10) Patent No.: US 8,110,837 B2
(45) Date of Patent: Feb. 7, 2012

(54) SENSING MODULE

(75) Inventors: Hung-Ching Lai, Hsinchu (TW);
Kuo-Hsiung Li, Hsinchu (TW);
Hui-Hsuan Chen, Hsinchu (TW);
Wei-Chung Wang, Hsinchu (TW)

(73) Assignee: Pixart Imaging Inc, Hsinchu (TW)

( * ) Notice: Subject to any disclaimer, the term of this patent is extended or adjusted under 35 U.S.C. 154(b) by 456 days.

(21) Appl. No.: 12/325,005

(22) Filed: Nov. 28, 2008

(65) Prior Publication Data

US 2010/0044722 A1 Feb. 25, 2010

(30) Foreign Application Priority Data

Aug. 20, 2008 (TW) ................................ 97131809 A

(51) Int. Cl.
*H01L 31/12* (2006.01)

(52) U.S. Cl. ............ 257/81; 257/99; 257/433; 257/668; 257/676; 257/684; 257/E33.076

(58) Field of Classification Search ..................... 257/81, 257/99, 433, 668, 676, 684, E33.076
See application file for complete search history.

(56) References Cited

U.S. PATENT DOCUMENTS 7,238,967 B2 * 7/2007 Kuwabara et al. ............... 257/98
7,768,048 B2 * 8/2010 Ueno et al. ..................... 257/293

* cited by examiner

*Primary Examiner* — Kenneth Parker
*Assistant Examiner* — Jose R Diaz
(74) *Attorney, Agent, or Firm* — Chun-Ming Shih

(57) ABSTRACT

A sensing module comprises a carrier, a sensor, a substrate, and a plurality of chips. The carrier has a carrying surface and a back surface opposite to the carrying surface. The sensor and the substrate are disposed on the carrying surface and are electrically connected to the carrier respectively. The chips are disposed on the substrate and are electrically connected to the substrate respectively. The production cost of the sensing module is low.

14 Claims, 4 Drawing Sheets

SENSING MODULE

BACKGROUND

1. Field of the Invention

The present invention relates to a sensing module, and more particularly to a sensing module having a plurality of chips.

2. Description of the Related Art

FIG. 1 is a schematic top view of a conventional image sensing module, and FIG. 2 is a schematic cross-sectional view along a line I-I' of FIG. 1. Referring to FIGS. 1 and 2, the conventional image sensing module 100 includes a printed circuit board (PCB) 110, an image sensor 120, a laser diode (LD) 130, a Zener diode 140 and an encapsulation 150. The image sensor 120 is disposed on the printed circuit board 110 and is electrically connected to the printed circuit board 110. The laser diode 130 and the Zener diode 140 are electrically connected to connection terminals 160a, 160b respectively, and the connection terminals 160a, 160b are electrically connected to the printed circuit board 110 through tin solders 170a, 170b respectively.

The conventional technology employs the encapsulation 150 to package the laser diode 130, the Zener diode 140 and essential conductors (not shown), such as wires, etc. Therefore, it can not only prevent the laser diode 130, the Zener diode 140 and the conductors from being damaged or prevent contact failure between the laser diode 130, the Zener diode 140 and the conductors during the transportation of the image sensing module 100, but also modularize the laser diode 130, the Zener diode 140 and the connection terminals 160a, 160b to simplify the assembling step of the image sensing module 100. In addition, the material of the encapsulation 150 is selected from a transparent material to permit the light provided by the laser diode 130 to be transmitted out of the encapsulation 150.

However, the cost of the encapsulation 150 is high, so the production cost of the image sensing module 100 is increased. Furthermore, the encapsulation 150 will reduce the intensity of the light provided by the laser diode 130, such that the light utilization efficiency of the image sensing module 100 is reduced.

BRIEF SUMMARY

The present invention relates to a sensing module to reduce the production cost.

To achieve the above advantages, a sensing module in accordance with an exemplary embodiment of the present invention is provided. The sensing module comprises a carrier, a sensor, a substrate, and a plurality of chips. The carrier has a carrying surface and a back surface opposite to the carrying surface. The sensor and the substrate are disposed on the carrying surface and are electrically connected to the carrier respectively. The chips are disposed on the substrate and are electrically connected to the substrate.

In an embodiment of the present invention, the sensing module further comprises a plurality of first wires, and the chips are electrically connected to the substrate through the first wires.

In an embodiment of the present invention, the sensing module further comprises a plurality of second wires, and the substrate is electrically connected to the carrier through the second wires.

In an embodiment of the present invention, the sensing module further comprises a plurality of conductive materials, and the substrate is electrically connected to the carrier through the conductive materials.

In an embodiment of the present invention, the sensing module further comprises a plurality of third wires, and the sensor is electrically connected to the carrier through the third wires.

In an embodiment of the present invention, the chips comprise a light-emitting chip and a Zener diode.

In an embodiment of the present invention, the light-emitting chip is a light-emitting diode or a laser diode.

In an embodiment of the present invention, the sensing module further comprises a shell and a cover. The shell has a bottom wall and a side wall jointing with the bottom wall. The bottom wall joints with a part of the back surface of the carrier, and the side wall extends from the back surface of the carrier to the carrying surface of the carrier and surrounds the sensor, the substrate and the chips. The cover is arranged above the carrying surface and joints with the side wall to cover the sensor, the substrate and the chips. In addition, the cover has two openings to expose the light-emitting chip and a sensing area of the sensor respectively.

In an embodiment of the present invention, the carrier is a lead frame.

In an embodiment of the present invention, the sensing module further comprises a shell and a cover. The shell is disposed on the carrying surface and surrounds the sensor, the substrate and the chips. The cover is arranged above the carrying surface and joints with the shell to cover the sensor, the substrate and the chips. In addition, the cover has two openings to expose the light-emitting chip and a sensing area of the sensor.

In an embodiment of the present invention, the carrier is a wiring board.

In an embodiment of the present invention, the sensor is an image sensor.

In the present invention, since the chips are assembled on the substrate, the present invention does not need the transparent capsulation to modularize the chips and the substrate. Thus, the present invention can save the cost of the transparent capsulation to reduce the production cost of the sensing module of the present invention.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Reference will now be made to the drawings to describe exemplary embodiments of the present sensing module, in detail. The following description is given by way of example, and not limitation.

Figure 1:
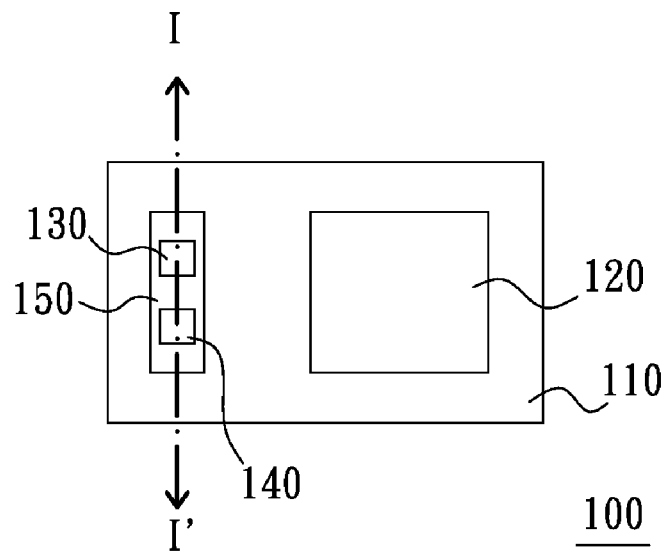
FIG. 1 is a schematic top view of a conventional image sensing module.
Figure 2:
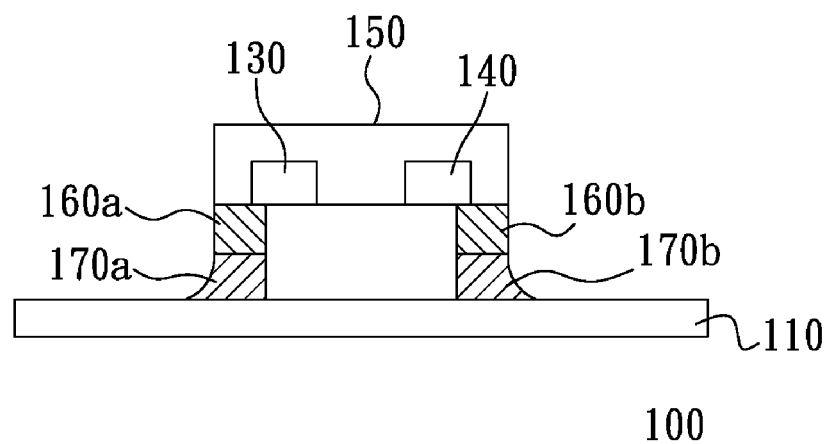
FIG. 2 is a schematic cross-sectional view along a line I-I' of FIG. 1.
Figure 3:
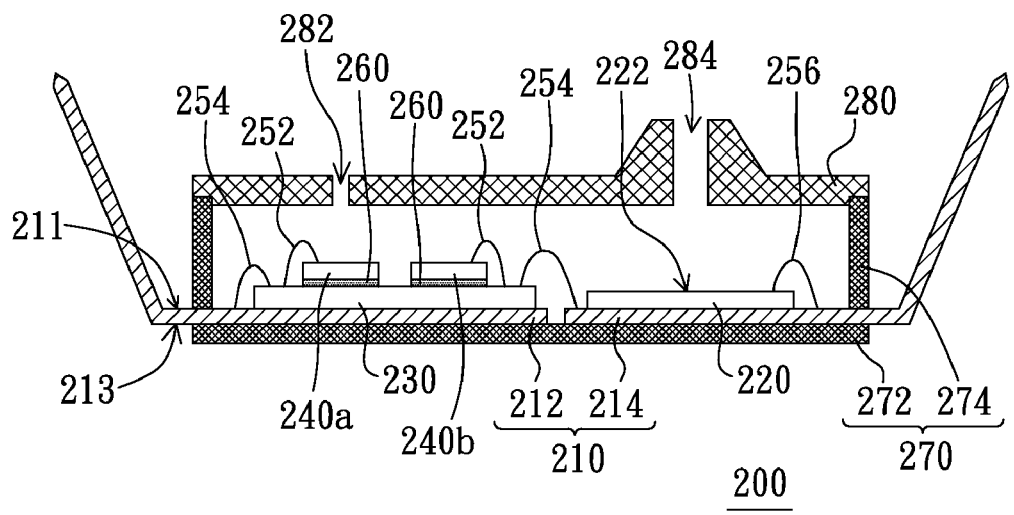
FIG. 3 is a schematic cross-sectional view of a sensing module in accordance with an exemplary embodiment of the present invention.

FIG. 3 is a schematic cross-sectional view of a sensing module in accordance with an exemplary embodiment of the present invention. Referring to FIG. 3, the sensing module 200 of the present embodiment includes a carrier 210, a sensor 220, a substrate 230 and a plurality of chips (such as a chip 240a and a chip 240b). The carrier 210 has a carrying surface 211 and a back surface 213 opposite to the carrying surface 211. The sensor 220 and the substrate 230 are disposed on the carrying surface 211 and are electrically connected to the carrier 210 respectively. The chips 240a and 240b are disposed on the substrate 230 and are electrically connected to the substrate 230 respectively.

In the above sensing module 200, the carrier 210 may be a lead frame and includes a plurality of supports 212 and 214. Since FIG. 3 is the schematic cross-sectional view of the sensing module 200, FIG. 3 only shows a support 212 and a support 214. However, there may be a plurality of supports 212 and a plurality of supports 214 in fact. In addition, the chips 240a and 240b may be electrically connected to the substrate 230 through a first wire 252 and a conductive adhesive 260 (such as silver adhesive). In another embodiment, the chips 240a and 240b may be electrically connected to the substrate 230 through a plurality of first wires 252.

In addition, the substrate 230 may be electrically connected to the carrier 210 through a plurality of second wires 254, and the sensor 220 may be electrically connected to the carrier 210 through a plurality of third wires 256. More specifically, the substrate 230 are electrically connected to the supports 212 and the supports 214 respectively through the second wires 254, and the sensor 220 are electrically connected to the supports 212 and the supports 214 respectively through the third wires 256. It should be noted that, since FIG. 3 is the schematic cross-sectional view of the sensing module 200, the third wires 256 electrically connected to the supports 212 and 214 respectively cannot be arranged in a same sectional plane. Thus, FIG. 3 only shows the third wires 256 electrically connected to the supports 214, and does not show the third wires 256 electrically connected to the supports 212.

In the present embodiment, the sensor 220 may be an image sensor. The chip 240a may be a light-emitting chip (such as a light-emitting diode or a laser diode), and the chip 240b may be a Zener diode for preventing the chip 240a from being damaged by the electrostatic discharge (ESD). In addition, the above sensing module 200 further includes a shell 270 and a cover 280. The shell 270 has a bottom wall 272 and a side wall 274 jointing with the bottom wall 272. The bottom wall 272 joints with a part of the back surface 211 of the carrier 210, and the side wall 274 extends from the back surface 211 of the carrier 210 to the carrying surface 213 of the carrier 210 and surrounds the sensor 220, the substrate 230 and the chips 240a and 240b. The cover 280 is arranged above the carrying surface 213 and joints with the side wall 274 to cover the sensor 220, the substrate 230 and the chips 240a and 240b. In addition, the cover 280 has two openings 282 and 284, wherein the opening 282 exposes the chip 240a, and the opening 284 exposes a sensing area 222 of the sensor 220. Thus, the light provided by the chip 240a can be transmitted out of the sensing module 200 through the opening 282, and the light can be transmitted to the sensor 220 through the opening 284 aftering being reflected.

In the present embodiment, since the chips 240a and 240b are assembled on the substrate 230, the transparent encapsulation is not needed to modularize the chips 240a and 240b and the substrate 230. In addition, during the manufacturing process of the sensing module 200, the substrate 230 assembling with the chips 240a and 240b is firstly disposed on the carrier 210. Then, a wire bonding process is preformed to electrically connect the chips 240a and 240b to the substrate 230. Thus, even if the transparent encapsulation is not employed to cover the chips 240a and 240b and the substrate 230, contact failure between the chip 240a and the substrate 230 and between the chip 240b and the substrate 230 can be prevented. Therefore, the present embodiment can save the cost of the transparent encapsulation to reduce the production cost of the sensing module 200. Furthermore, since the sensing module 200 of the present embodiment does not employ the transparent encapsulation to cover the chip 240a, the intensity of the light provided by the chip 240a will not be reduced by the transparent encapsulation. Thus, compared with the conventional art, the sensing module 200 of the present embodiment has higher light utilization efficiency.

Figure 4:
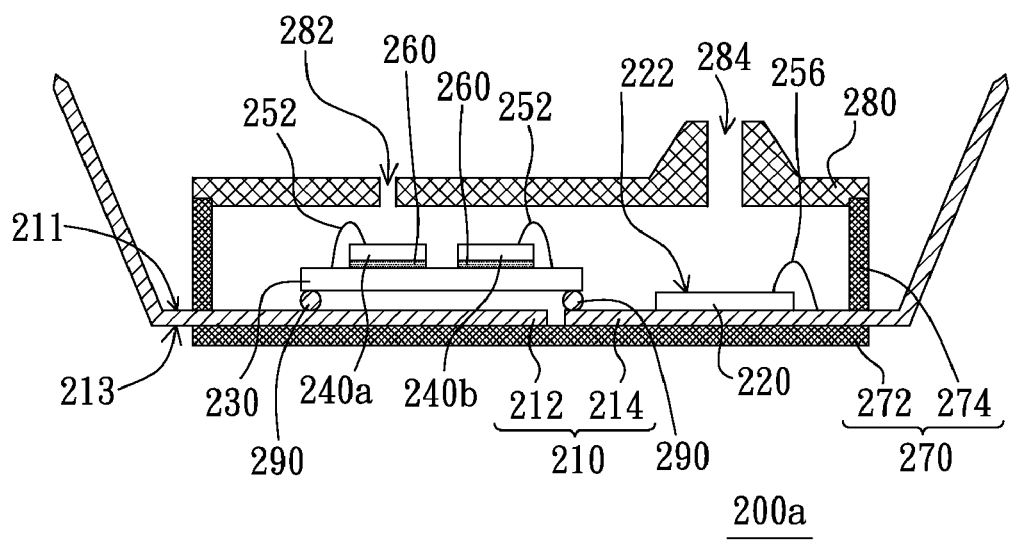
FIG. 4 is a schematic cross-sectional view of a sensing module in accordance with another exemplary embodiment of the present invention.

FIG. 4 is a schematic cross-sectional view of a sensing module in accordance with another exemplary embodiment of the present invention. Referring to FIG. 4, the sensing module 200a of the present embodiment is similar to the sensing module 200 of FIG. 3, except that the substrate 230 is electrically connected to the carrier 230 in a different mode. More specifically, the substrate 230 of the sensing module 200 is electrically connected to the carrier 210 through the second wires 254, and the substrate 230 of the sensing module 200a is electrically connected to the carrier 210 through a plurality of conductive materials 290. In the present embodiment, the conductive materials 290 may be tin balls. However, in other embodiments, the conductive materials 290 may be conductive adhesives or other suitable conductive materials.

Figure 5:
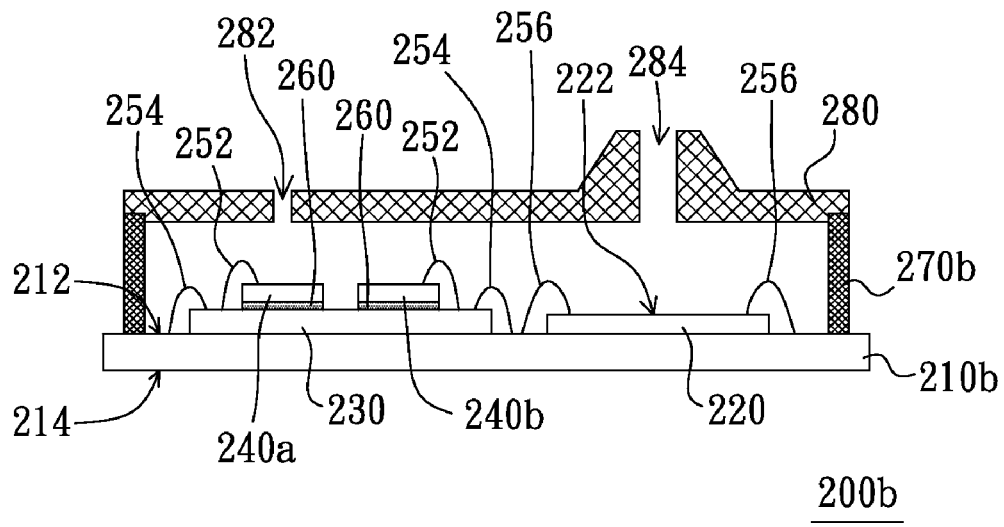
FIG. 5 is a schematic cross-sectional view of a sensing module in accordance with another exemplary embodiment of the present invention.

FIG. 5 is a schematic view of a sensing module in accordance with another exemplary embodiment of the present invention. Referring to FIG. 5, the sensing module 200b of the present embodiment is similar to the sensing module 200 of FIG. 3, except that the carriers are different. In specific, the carrier 210 of the sensing module 200 is a lead frame, and the carrier 210b of the sensing module 200b is a wiring board, such as a printed circuit board. In addition, the shell 270b of the sensing module 200b is disposed on the carrying surface 212, and surrounds the sensor 220, the substrate 230 and the chips 240a and 240b.

Figure 6:
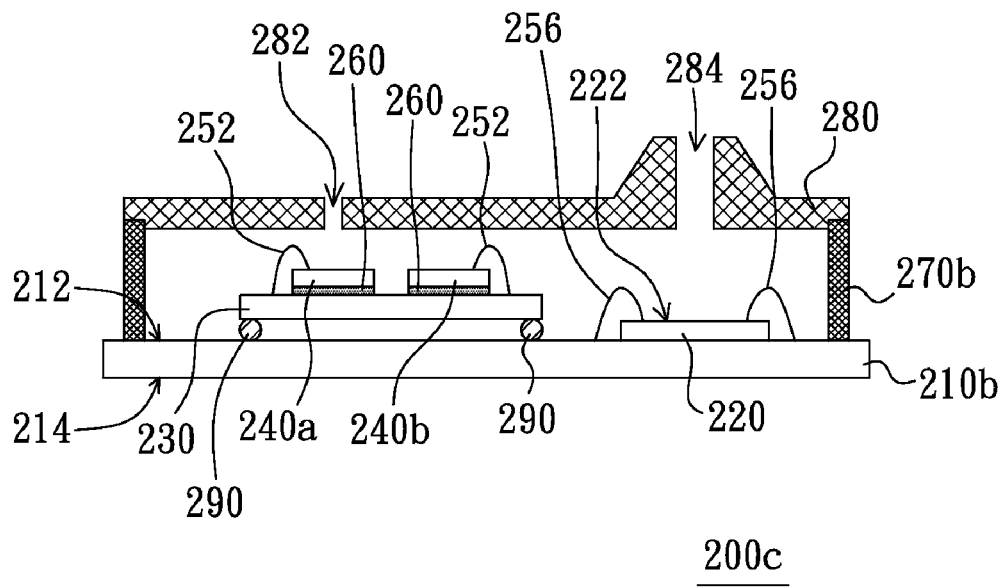
FIG. 6 is a schematic cross-sectional view of a sensing module in accordance with another exemplary embodiment of the present invention.

FIG. 6 is a schematic view of a sensing module in accordance with another exemplary embodiment of the present invention. Referring to FIG. 6, the sensing module 200c of the present embodiment is similar to the sensing module 200b of FIG. 5, except that the substrate 230 of the sensing module 200c is electrically connected to the carrier 210b through the conductive materials 290. In the present embodiment, the conductive materials 290 may be the tin balls. However, in other embodiments, the conductive materials 290 may be the conductive adhesives or other suitable conductive materials.

Figure 7:
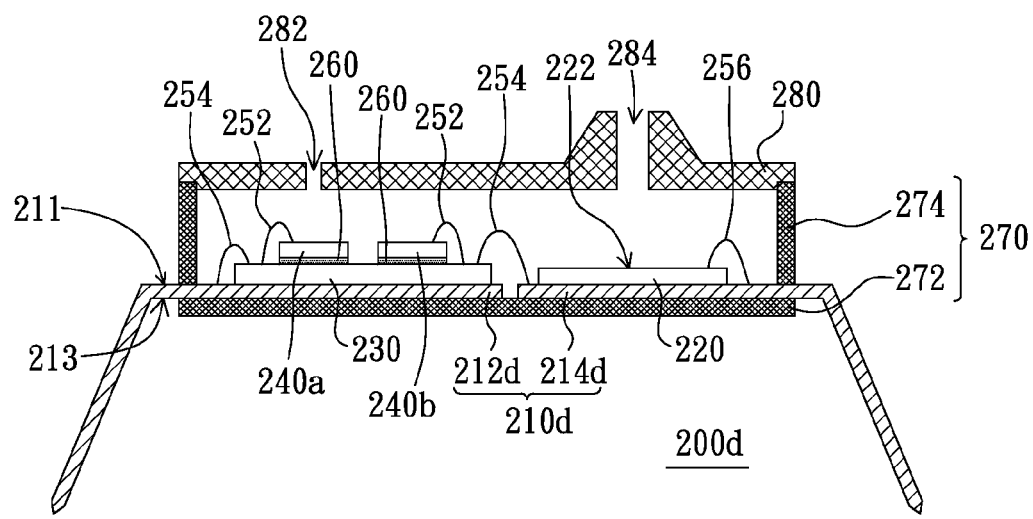
FIG. 7 is a schematic cross-sectional view of a sensing module in accordance with another exemplary embodiment of the present invention.

FIG. 7 is a schematic cross-sectional view of a sensing module in accordance with another exemplary embodiment of the present invention. Referring to FIG. 7, the sensing module 200d of the present embodiment is similar to the sensing module 200 of FIG. 3, and only the difference will be described below. In the sensing module 200, the supports 212 and 214 of the carrier 210 are bent upward. However, in the sensing module 200d, the supports 212d and 214d of the carrier 210d are bent downward. In other words, the supports of the carrier of the present invention can be bent upward or downward. Advantages of the sensing module 200d are similar to those of the sensing module 200, and will not be described again herein.

Figure 8:
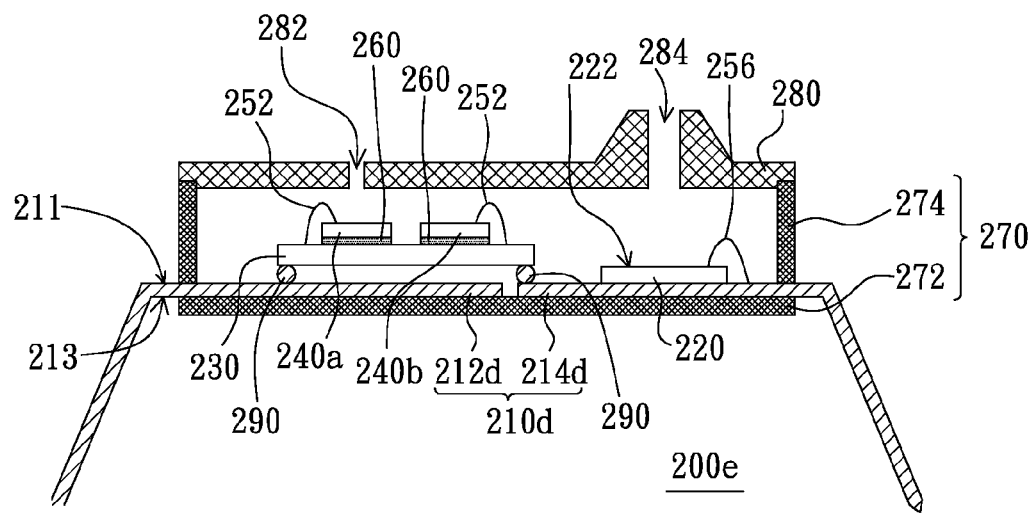
FIG. 8 is a schematic cross-sectional view of a sensing module in accordance with another exemplary embodiment of the present invention.

FIG. 8 is a schematic cross-sectional view of a sensing module in accordance with another exemplary embodiment of the present invention. Referring to FIG. 8, the sensing module 200e of the present embodiment is similar to the sensing module 200a of FIG. 4, and only the difference will be described below. In the sensing module 200a, the supports 212 and 214 of the carrier 210 are bent upward. However, in the sensing module 200e, the supports 212d and 214d of the carrier 210d are bent downward. In other words, the supports of the carrier of the present invention can be bent upward or downward. Advantages of the sensing module 200e are similar to those of the sensing module 200a, and will not be described again herein.

In summary, the sensing module of the present invention at least includes following advantages:

Firstly, in the present invention, since the chips are assembled on the substrate, the present invention does not need the transparent capsulation to modularize the chips and the substrate. Thus, the production cost of the sensing module of the present invention can be reduced.

Secondly, in the embodiment of one of the chips being the light-emitting chip, since the transparent capsulation is not employed to cover the chips, the intensity of the light provided by the light-emitting chip will not be reduced by the transparent capsulation. Thus, the light utilization efficiency of the sensing module of the present invention can be improved.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A sensing module, comprising:
a carrier having a carrying surface and a back surface opposite to the carrying surface;
a sensor disposed on the carrying surface and electrically connected to the carrier;
a substrate disposed on the carrier and electrically connected to the carrying surface;
at least one chip disposed on the substrate and electrically connected to the substrate;
a shell surrounding the sensor, the substrate and the at least one chip; and
a cover arranged above the carrying surface and jointing with the shell to cover the sensor, the substrate and the at least one chip, wherein the cover has two openings to respectively expose the at least one chip and a sensing area of the sensor, at least one of the two openings is a partial opening partially uncovering said at least one chip and the sensing area of the sensor.

2. The sensing module as claimed in claim 1, further comprising a plurality of first wires, wherein the at least one chip is electrically connected to the substrate through the first wires.

3. The sensing module as claimed in claim 1, further comprising a plurality of second wires, wherein the substrate is electrically connected to the carrier through the second wires.

4. The sensing module as claimed in claim 1, further comprising a plurality of conductive materials, wherein the substrate is electrically connected to the carrier through the conductive materials.

5. The sensing module as claimed in claim 1, further comprising a plurality of third wires, wherein the sensor is electrically connected to the carrier through the third wires.

6. The sensing module as claimed in claim 1, wherein the at least one chip comprises a light-emitting chip.

7. The sensing module as claimed in claim 6, wherein the light-emitting chip is one of a light-emitting diode and a laser diode.

8. The sensing module as claimed in claim 6, wherein the shell has a bottom wall and a side wall jointing with the bottom wall, the bottom wall jointing with a part of the back surface of the carrier, and the side wall extending from the back surface of the carrier to the carrying surface of the carrier and surrounding the sensor, the substrate and the at least one chip; and
the cover exposes the light-emitting chip and the sensing area of the sensor respectively.

9. The sensing module as claimed in claim 8, wherein the carrier is a lead frame.

10. The sensing module as claimed in claim 6, wherein the the cover exposes the light-emitting chip and the sensing area of the sensor.

11. The sensing module as claimed in claim 10, wherein the carrier is a wiring board.

12. The sensing module as claimed in claim 6, wherein the sensor is an image sensor.

13. The sensing module as claimed in claim 1, wherein the carrier is one of a lead frame and a wiring board.

14. The sensing module as claimed in claim 1, wherein the sensor is an image sensor.

* * * * *